United States Patent
Zhao (10) Patent No.: US 11,495,603 B1
(45) Date of Patent: Nov. 8, 2022

(54) SEMICONDUCTOR DEVICE AND ITS PREPARATION METHOD

(71) Applicant: CHANGXIN MEMORY TECHNOLOGIES, INC., Hefei (CN)

(72) Inventor: Zhongqiang Zhao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/442,428

(22) PCT Filed: Jun. 30, 2021

(86) PCT No.: PCT/CN2021/103751
§ 371 (c)(1),
(2) Date: Sep. 23, 2021

(87) PCT Pub. No.: WO2022/052593
PCT Pub. Date: Mar. 17, 2022

(30) Foreign Application Priority Data

Sep. 14, 2020 (CN) .......................... 202010962471.6

(51) Int. Cl.
*H01L 27/108* (2006.01)

(52) U.S. Cl.
CPC .. *H01L 27/10855* (2013.01); *H01L 27/10814* (2013.01)

(58) Field of Classification Search
None
See application file for complete search history.

(56) References Cited

U.S. PATENT DOCUMENTS

| | | | | |
|---|---|---|---|---|
| 10,978,457 | B2* | 4/2021 | Feng | H01L 27/10885 |
| 11,011,526 | B2* | 5/2021 | Park | H01L 27/10897 |
| 2016/0020213 | A1* | 1/2016 | Kim | H01L 27/10855 |
| | | | | 438/618 |
| 2019/0333918 | A1* | 10/2019 | Kim | H01L 29/7926 |
| 2021/0134804 | A1* | 5/2021 | Jung | H01L 27/10852 |
| 2021/0384197 | A1* | 12/2021 | Jung | H01L 21/02181 |
| 2022/0173107 | A1* | 6/2022 | Moon | H01L 27/10888 |

FOREIGN PATENT DOCUMENTS

| | | |
|---|---|---|
| CN | 108010913 A | 5/2018 |
| CN | 110718532 A | 1/2020 |
| CN | 111430308 A | 7/2020 |

OTHER PUBLICATIONS

International Search Report and English Translation cited in PCT/CN2021/103751 dated Sep. 24, 2021, 9 pages.
Written Opinion and English Translation cited in PCT/CN2021/103751 dated Sep. 24, 2021, 6 pages.

* cited by examiner

*Primary Examiner* — Steven M Christopher
(74) *Attorney, Agent, or Firm* — Cooper Legal Group, LLC (57) ABSTRACT

The present disclosure provides a semiconductor device and its preparation method, wherein the preparation method includes providing a substrate, forming bit line units, capacitor contacts and a conductive layer on the substrate, patterning the conductive layer on the substrate by step-by-step etching, etching first grooves to form first conductive parts positioned above the bit line units, protecting sidewalls of the first grooves, and then etching second grooves to form second conductive parts covering sidewalls of the bit line units and third conductive parts covering the capacitor contacts.

10 Claims, 7 Drawing Sheets

| A substrate is provided, wherein a plurality of access units are formed on the substrate, and each access unit comprises a bit line unit and a capacitor contact; the bit line units and the capacitor contacts of the access units are alternately arranged one by one and insulated from each other, and the bit line units are higher than the capacitor contacts, so that a recess is formed between two adjacent bit line units; a conductive layer covering the access units is further formed on the substrate, and the recesses are filled with the conductive layer; | S100 |
|---|---|
| Parts of the conductive layer corresponding to the recesses are etched to form first grooves corresponding to each access unit in the conductive layer; in any access unit, the sidewall of the first groove close to the bit line unit is farther away from the sidewall of the same side of the recess. | S200 |
| Protective layers are formed on the sidewalls of the first grooves; | S300 |
| The first grooves are etched downwards to etch away parts of the conductive layer located in the recesses, and the conductive layer covering sidewalls of the bit line units and bottoms of the recesses is retained to form the second grooves; parts of the conductive layer positioned above the bit line units are the first conductive parts, parts of the conductive layer covering sidewalls of the bit line units and connected with the first conductive parts are the second conductive parts, and parts of the conductive layer covering bottoms of the recesses and connected with the second conductive parts are the third conductive parts; | S400 |
| The protective layers are removed | S500 |
| Storage capacitors are formed on sides of the first conductive parts away from the substrate, so that the storage capacitors are in contact with the first conductive parts; | S600 |

SEMICONDUCTOR DEVICE AND ITS PREPARATION METHOD

CROSS-REFERENCE TO RELATED APPLICATIONS

The present disclosure claims priority for a Chinese patent application with an application number of 202010962471.6 named "SEMICONDUCTOR DEVICE AND ITS PREPARATION METHOD" filed on Sep. 14, 2020, of which the entire content is incorporated herein by reference.

TECHNICAL FIELD

The present disclosure relates to the art of semiconductor, and specifically, relates to a semiconductor device and its preparation method.

BACKGROUND

Dynamic random access memory (DRAM) is a commonly used memory, and with the miniaturization of the storage capacitor area on a DRAM cell array, the requirement on the accuracy of the photo-etching technology in DRAM preparation is increasingly higher, and misalignment of the photo-etching technology has an increasing impact on the DRAM.

The capacitor is electrically connected with the capacitor contact through a conductive layer. In the preparation process, patterning is required for the conductive layer, and during patterning with the photo-etching technology, in case of misalignment, a relative movement may occur between the bottom electrode layer of the storage capacitor and the capacitor contact, so the pattern of the conductive layer may be deformed, and the conductive layer may have higher resistance or may even break. Finally, the contact area between the storage capacitor and the capacitor contact is reduced, the contact resistance is increased, and the transmission efficiency of the DRAM unit array is reduced.

It should be noted that, the information disclosed in the above background section is only intended to enhance the understanding of the background of the present disclosure, and therefore may contain information that does not form the prior art that is already known to those ordinarily skilled in the art.

SUMMARY

According to one aspect of the present disclosure, a preparation method of a semiconductor device is provided, including:

providing a substrate, wherein there is a plurality of access units formed on the substrate, and each of the access units comprises a bit line unit and a capacitor contact; the bit line units and the capacitor contacts of the plurality of access units are alternately arranged one by one and insulated from each other, and the bit line units are higher than the capacitor contacts, so that a recess is formed between the two adjacent bit line units; a conductive layer covering each of the access units is further formed on the substrate, and each of the recesses is filled with the conductive layer;

etching parts of the conductive layer corresponding to the recesses and forming first grooves corresponding to each of the access units in the conductive layer; in the access units, sidewalls of the first grooves close to the bit line units are farther away from the bit line units compared with the sidewalls of the same side of the recesses;

forming protective layers on sidewalls of the first grooves;

etching the first grooves downwards to etch away parts of the conductive layer located in the recesses, and retain the conductive layer covering sidewalls of the bit line units and bottoms of the recesses, to form the second grooves; parts of the conductive layer positioned above the bit line units are the first conductive parts, parts of the conductive layer covering the sidewalls of the bit line units and connected with the first conductive parts are the second conductive parts, and parts of the conductive layer covering the bottoms of the recesses and connected with the second conductive parts are the third conductive parts;

removing the protective layers;

forming storage capacitors on sides of the first conductive parts away from the substrate, so that the storage capacitors are in contact with the first conductive parts.

According to another aspect of the present disclosure, a semiconductor device is provided, obtained by the above preparation method.

It should be understood that both the above general description and the following detailed description are exemplary and explanatory only, and are not restrictive of the present disclosure.

BRIEF DESCRIPTION OF THE DRAWINGS

The drawings here, which are incorporated into and form part of the specification, show embodiments in accordance with the present disclosure, and serve to explain the principle of the present disclosure together with the specification. Obviously, the drawings described below are merely some embodiments of the present disclosure, and those ordinarily skilled in the art can derive other drawings from these drawings without making creative efforts.

In the drawings: 1. substrate; 2. bit line unit; 3. capacitor contact; 4. conductive layer; 5. insulating layer; 6. storage capacitor; 10. support layer; 21. bit line contact layer; 22. first barrier layer; 23. bit line metal layer; 24. bit line insulating layer; 25. second barrier layer; 31. capacitor contact layer; 32. metal conductive layer; 33. third barrier layer; 41. first conductive part; 42. second conductive part; 43. third conductive part; 101. capacitor hole; 61. bottom electrode; 62. dielectric layer; 63. top electrode; 7. insulating sidewall; 8. protective layer; 81. protective material; 91. initial groove; 92. first groove; 93. second groove; 94. recess.

DETAILED DESCRIPTION

Exemplary implementations will now be described more fully with reference to the accompanying drawings. However, the exemplary implementations could be implemented in many forms, and should not be construed as being limited to the implementations set forth herein; on the contrary, these implementations are provided to make the present disclosure comprehensive and complete, and to fully convey the ideas of these exemplary implementations to those skilled in the art. The same reference numbers in the drawings denote an identical or similar structure, and thus a detailed description thereof is omitted.

Figure 1:
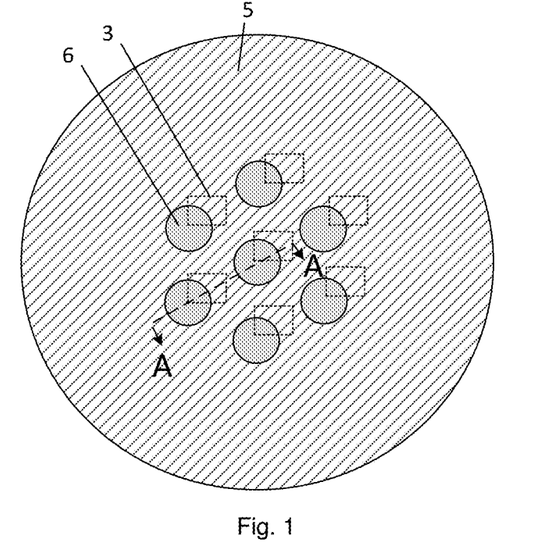
FIG. 1 is a top view of a semiconductor device according to an implementation of the present disclosure.
Figure 2:
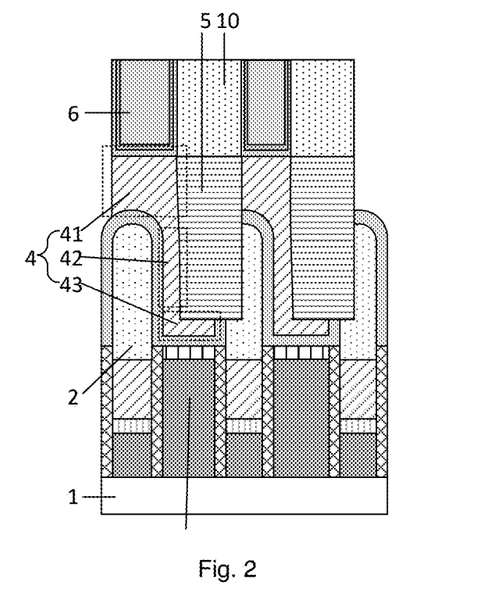
FIG. 2 is a schematic diagram of a cross-section in direction A-A in FIG. 1.

In the related art, FIG. 1 is a structural top view of a semiconductor device, which shows a partial capacitance distribution structure, and FIG. 2 is a schematic diagram of a cross-section in direction A-A in FIG. 1, which shows a schematic diagram of a cross-section including two capacitors. In the semiconductor device, a plurality of bit line units 2 and a plurality of capacitor contacts 3 are provided on the substrate 1, wherein the plurality of bit line units 2 and the plurality of capacitor contacts 3 are alternately arranged one by one and insulated from each other. Since there are usually more film layers of bit line unit 2 than those of capacitor contact 3, and the film layers of bit line unit 2 are thicker than those of capacitor contact 3, that is, the bit line unit 2 is higher than the capacitor contact 3, so a recess may be formed between two adjacent bit line units 2. It should be noted that the height of the bit line unit refers to the distance from the upper surface of the bit line unit to the substrate; similarly, the height of the capacitor contact refers to the distance from the upper surface of the capacitor contact to the substrate.

One of the storage capacitors 6 and the access unit where the corresponding bit line unit 2 and capacitor contact 3 are located is taken as an example. A conductive layer 4 and an insulating layer 5 are provided above the capacitor contact 3, and the insulating layer 5 is used to isolate the conductive layers 4 of two adjacent access units. A support layer 10 is provided on the conductive layer 4 and the insulating layer 5, a capacitor hole which penetrates through the support layer 10 from top to bottom is formed in the support layer 10, and the capacitor hole exposes the conductive layer 4. A storage capacitor 6 is provided in the capacitor hole, and electrically connected with the capacitor contact 3 through the conductive layer 4. In order to form the storage capacitors 6 into the hexagonal closest packing shown in FIG. 1, the storage capacitors 6 need to be staggered with the capacitor contacts 3, that is, the storage capacitors 6 are not located right above the capacitor contacts 3, but are shifted toward the bit line units, as shown in FIG. 1, wherein the circles represent the storage capacitors 6, and the dashed boxes represent the positions of the capacitor contacts 3 below. Correspondingly, the conductive layer 4 also needs to be shifted toward the bit line units, so the conductive layer 4 needs to be designed into the shape shown in the dashed boxes in FIG. 2, that is, the conductive layer comprises the first conductive part 41, the second conductive part 42 and the third conductive part 43 connected in sequence, the first conductive part 41 is located above the bit line unit 2, the second conductive part 42 covers the left sidewall of the recess, and the third conductive part 43 covers the bottom of the recess. The capacitor is located above the first conductive part 41, thereby electrically connected with the capacitor contact through the three conductive parts. The remainder of the recess is filled with the insulating layer 5.

In the preparation of the semiconductor device with the above structure, in order to form the shape of the conductive layer 4, continuous patterning is required for the conductive layer 4; in the patterning process, the photo-etching technology is often used; and in case of misalignment in the photo-etching technology, the second conductive part 42 is made thinner, so the contact resistance between the storage capacitor 6 and the capacitor contact 3 is increased, and the data transmission efficiency of the access unit is reduced. In severe cases, the second conductive part 42 may even break, and the storage capacitor 6 and the capacitor contact 3 cannot contact with each other, finally rendering the access unit unable to access data.

Figure 3:
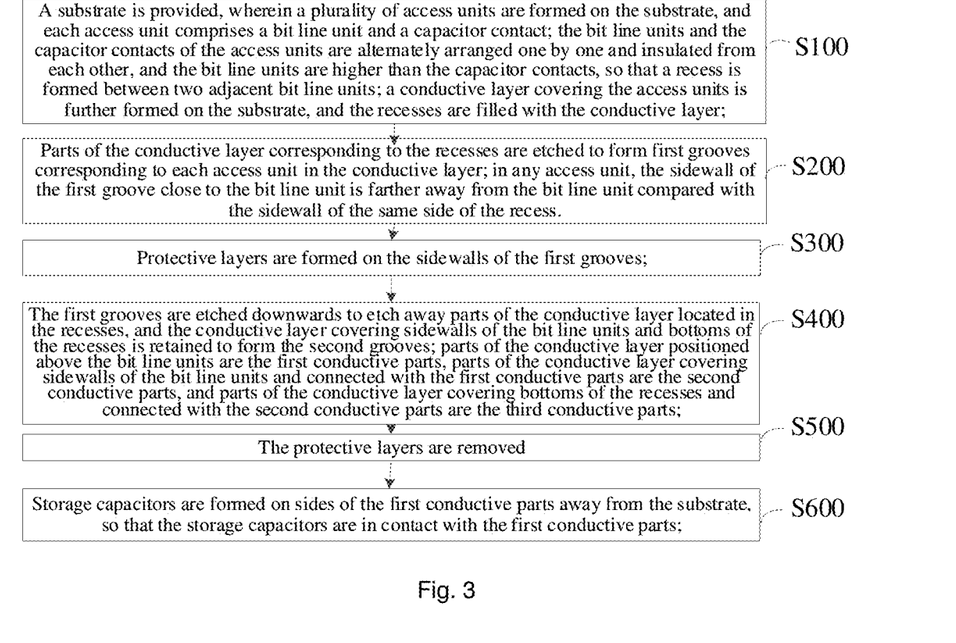
FIG. 3 is a flowchart of a preparation method of a semiconductor device according to an implementation of the present disclosure.

In order to solve the above problem, an implementation of the present disclosure provides a preparation method of a semiconductor device, which includes the following steps, with reference to FIG. 3:

Step S100: A substrate 1 is provided, wherein a plurality of access units are formed on the substrate 1, and each of the access units comprises a bit line unit 2 and a capacitor contact 3; the bit line units 2 and the capacitor contacts 3 of the plurality of access units are alternately arranged one by one and insulated from each other, and the bit line units 2 are higher than the capacitor contacts 3, so that a recess is formed between two adjacent bit line units 2; a conductive layer 4 covering each of the access units is further formed on the substrate 1, and the recesses are filled with the conductive layer 4.

Step S200: Parts of the conductive layer 4 corresponding to the recesses are etched to form the first grooves 92 corresponding to each of the access units in the conductive layer 4; in any one of the access units, the sidewall of the first groove 92 close to the bit line unit is farther away from the bit line unit 2 compared with the sidewall of the same side of the recess.

Step S300: Protective layers 8 are formed on the sidewalls of the first grooves 92.

Step S400: The first grooves 92 are etched downwards to etch away parts of the conductive layer 4 located in the recesses, and the conductive layer 4 covering sidewalls of the bit line units 2 and bottoms of the recesses is retained to form the second grooves 93. Parts of the conductive layer positioned above the bit line units are the first conductive parts, parts of the conductive layer covering sidewalls of the bit line units and connected with the first conductive parts are the second conductive parts, and parts of the conductive layer covering bottoms of the recesses and connected with the second conductive parts are the third conductive parts.

Step S500: The protective layers 8 are removed.

Step S600: Storage capacitors 6 are formed on sides of the first conductive parts 41 away from the substrate 1, so that the storage capacitors 6 are in contact with the first conductive parts 41.

When the method disclosed by the present disclosure is used for patterning the conductive layer 4 on the substrate 1, a step-by-step etching method is used, where the conductive layer 4 is first etched to form the first grooves 92, and the non-etched parts on the top are used as the first conducting parts 41 connected with the capacitors 6; then, sidewalls of the first grooves 92 are protected, the conductive layer 4 is further etched downwards to form the second grooves 93, and after the protective layers 8 are removed, the vertical second conductive parts 42 and the bottom third conductive parts 43 are formed to finally form the conductive layer 4. Since a step-by-step etching method is used, parameters such as composition of the etching gas, etching time and etching speed in each step can be adjusted flexibly, so that the three parts of the conductive layer 4 can be etched into ideal shapes. In particular, when the second step of etching is performed, since protective layers 8 are provided, this step of etching will not affect sidewalls of the conductive layer 4, making the vertical second conductive parts 42 finally formed thicker, so that the conductive layer 4 is not easy to break here, and it is not easy to increase the resistance because the second conductive parts 42 are too narrow, so that the storage capacitors 6 and the capacitor contacts 3 can form good electric contact, thereby ensuring a sufficient contact area and a lower contact resistance. The alignment accuracy requirement for the photo-etching technology in the preparation process is reduced, thereby improving the yield rate.

Figure 4:
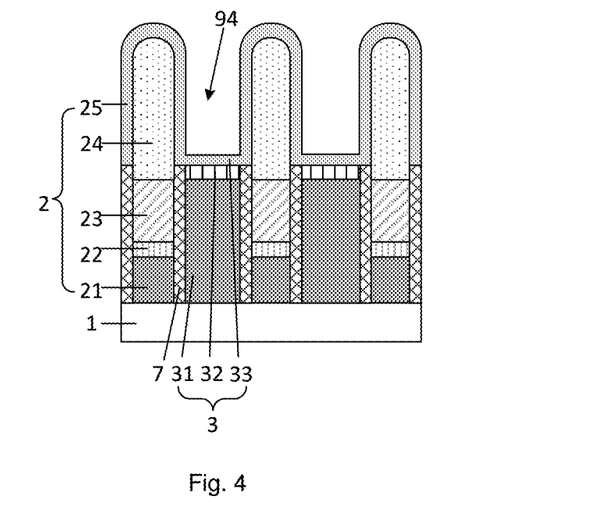
FIG. 4 is a schematic structural diagram of bit line units and capacitor contacts formed according to an implementation of the present disclosure.

The preparation method for a semiconductor device according to implementations of the present disclosure will be described in detail step by step with reference to FIG. 4 to FIG. 14:

Step S100: A substrate 1 is provided, as shown in FIG. 4, wherein a plurality of access units are formed on the substrate 1, and the access units comprise bit line units 2 and capacitor contacts 3; the bit line units 2 and the capacitor contacts 3 of the plurality of access units are alternately arranged one by one and insulated from each other, and the bit line units 2 are higher than the capacitor contacts 3, so that a recess 94 is formed between two adjacent bit line units 2. A conductive layer 4 covering each of the access units is also formed on the substrate 1, and each of the recesses 94 is filled with the conductive layer 4;

In this step, the substrate 1 is a semiconductor substrate, and the material forming the substrate 1 includes, but is not limited to, single crystal silicon, polycrystalline silicon, gallium nitride or sapphire; in addition, when the substrate 1 is a single crystal substrate or a polycrystalline substrate, the substrate may also be an intrinsic silicon substrate or a lightly doped silicon substrate, and further, the substrate may be an N-type polycrystalline silicon substrate or a P-type polycrystalline silicon substrate.

The substrate 1 is provided with a shallow groove isolation structure, whose structure defines a plurality of active areas, which are provided with transistors, which comprise gates, sources and drains. The gates are used for connection with the word lines, the sources are used for connection with the capacitors, and the drains are used for connection with the bit lines. The specific structures of the transistors and the word lines can be existing conventional structures, and are not described herein.

The bit line units 2 and the capacitor contacts 3 may be of various existing structures. As shown in FIG. 4, which is a schematic structural diagram of a bit line unit 2 in an embodiment, the bit line unit 2 includes a bit line contact layer 21, a first barrier layer 22, a bit line metal layer 23, a bit line insulating layer 24, and a second barrier layer 25, which are sequentially formed on the substrate 1 from bottom to top. The bit line contact layer 21, the first barrier layer 22, and the bit line metal layer 23 form a bit line structure layer, and the bit line insulating layer 24 and the second barrier layer 25 form a bit line protection layer, that is, the bit line protection layer is located on the side of the bit line structure layer away from the substrate. The bit line contact layer 21 serves to connect the bit line metal layer 23 with the drain of the transistor. The material of the bit line contact layer 21 may be polysilicon or the like. The first barrier layer 22 is used to prevent metal ions from diffusing into the substrate 1 when the bit line metal layer 23 is prepared, and protect the substrate 1. In addition, the first barrier layer 22 can also be used as an adhesion layer to reduce the generation of voids and defects because voids are generated due to poor adhesion of the upper bit line metal layer 23. The material of the first barrier layer 22 may be titanium nitride or the like. The bit line metal layer 23 is a bit line, and the material thereof may be a metal material with better conductivity, such as tungsten. The bit line insulating layer 24 insulates and protects the bit line metal layer 23 and prevents a short circuit between the bit line unit 2 and the upper conductive layer 4. The material of the bit line insulating layer 24 may be silicon nitride or the like. The second barrier layer 25, similar to the first barrier layer 22, can prevent metal ions from diffusing into the substrate 1 during the preparation of the upper conductive layer 4, and can also serve as an adhesion layer between the upper and lower layers. The material may be the same as or different from the material of the first barrier layer 22.

As shown in FIG. 4, which is a schematic cross-sectional structure diagram of a capacitor contact 3 in an embodiment, the capacitor contact 3 comprises a capacitor contact layer 31, a metal conductive layer 32, and a third barrier layer 33 which are sequentially formed on the substrate 1 from bottom to top. The capacitor contact layer 31 is used to connect the storage capacitor 6 to the source of the transistor. The material of the capacitor contact layer 31 may be polysilicon or the like. The metal conductive layer 32 functions as an ohmic contact between the conductive layer 4 and the capacitor contact layer 31 to reduce the contact resistance. The material of the metal conductive layer 32 may be cobalt silicide (CoSix). The third barrier layer 33 has the same function as the second barrier layer 25. Besides, the third barrier layer 33 should be conductive so that the upper conductive layer 4 can be electrically connected with the lower layer. The preferable material is titanium nitride. When the third barrier layer 33 and the second barrier layer 25 are made of the same material, they can be formed in the same step and can be connected as a full film layer as shown in the drawing. In this embodiment, the part of the bit line unit 2 higher than the capacitor contact 3 is a bit line protection layer, and the bottom surface of the bit line protection layer is not higher than the bottom surface of the recess 94.

It should be noted that one bit line unit 2 and one capacitor contact 3 belong to the same access unit. Of course, the access unit also comprises a transistor, a word line, and other structures correspondingly connected with them. As shown in the drawing, the adjacent bit line unit 2 and the capacitor contact 3 are insulated from each other, so an insulating sidewall 7 may be formed between them, and the material of the insulating sidewall 7 may be silicon nitride or the like.

The film layers can be formed by various methods such as chemical deposition, physical deposition, atomic deposition, and liquid epitaxy, etc., which will not be repeated here.

In this embodiment, since there are more film layers of the bit line unit 2 than those of the capacitor contact 3, and the bit line unit 2 is higher than the capacitor contact 3, a recess 94 is formed above the capacitor contact 3 between two adjacent bit line units 2 as shown in FIG. 4.

Figure 5:
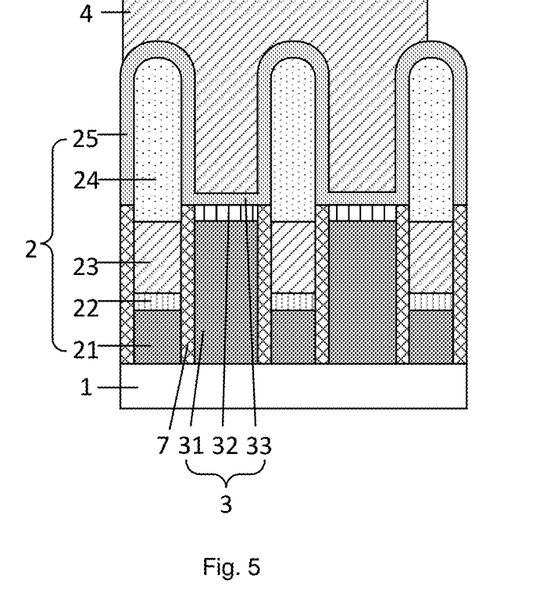
FIG. 5 is a schematic structural diagram of a conductive layer formed according to an implementation of the present disclosure.

As shown in FIG. 5, when the conductive layer 4 covering the bit line units 2 and the capacitor contacts 3 is formed on the substrate 1, the conductive layer 4 fills the recesses 94. The conductive layer 4 is used to connect the storage capacitors 6 and the capacitor contacts 3, and is preferably made of metallic tungsten, which has good step coverage and gap filling performance, and can form a film layer with good electrical connection characteristics. The film layer can be formed by chemical deposition, physical deposition, and the like. During the deposition of metallic tungsten, the dissociation of the precursor WCl6 can generate Cl—, and the third barrier layers 33 provided in the capacitor contacts 3 can prevent Cl— from diffusing into the silicon substrate 1 which may damage the silicon substrate 1.

Figure 7:
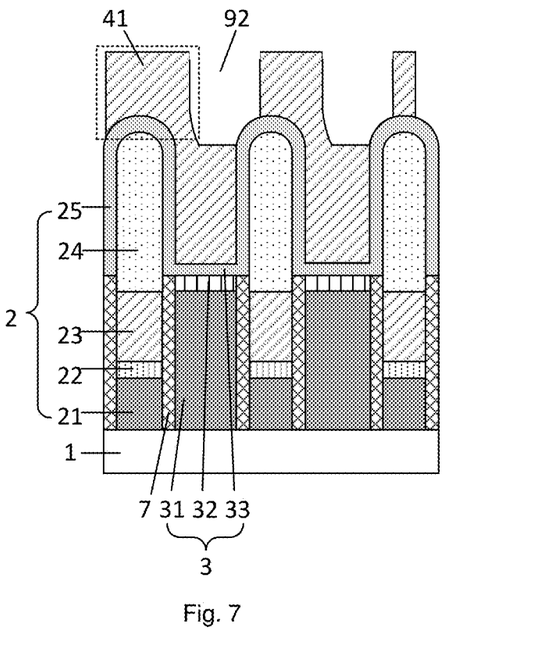
FIG. 7 is a schematic structural diagram of first grooves formed according to an implementation of the present disclosure.

Step S200: Parts of the conductive layer 4 corresponding to the recesses are etched to form first grooves 92 corresponding to each of the access units in the conductive layer 4. In any one of the access units, the sidewall of the first groove 92 close to the bit line unit is farther away from the bit line unit 2 compared with the sidewall on the same side of the recess 94.

As shown in FIG. 7, being a kind of schematic structural diagram of cross-section of the first grooves, in an access unit, the sidewall of the first groove 92 close to the bit line unit is farther away from the bit line unit 2 than the sidewall on the same side of the recess, that is, the left sidewall of the first groove 92 is located on the right side of the left sidewall of the recess in the drawing; on one hand, a conductive layer with a certain thickness can be retained on the left side in the recess during subsequent downward etching to form a second conductive part 42, and on the other hand, the first conductive part 41 can be located more to the right side in the horizontal direction, which helps to make the capacitor 6 above into the hexagonal closest packing. In this step, referring to the dashed line box in the drawing, the non-etched part above the bit line unit 2 is the first conductive part 41. It should be noted that, in the present application, only the position of the left sidewall of the first groove is defined, and the position of the right sidewall is not defined; in the embodiment shown in the drawing, the left sidewall of the first groove 92 is located above the recess, and the right sidewall is located above the adjacent bit line unit 2; the position of the sidewalls of the first groove 92 in the drawing is only an example, and in other embodiments, the position of the right sidewall thereof may also be moved leftward to be flush with the left sidewall of the adjacent bit line unit on the right. It should be noted that the width of the first groove 92 should be such that there is a sufficient contact area of the first conductive part 41 and a sufficient insulation distance from the first conductive part 41 of the adjacent access unit; meanwhile, the second conductive part 42 of a sufficient thickness can also be retained.

Figure 6:
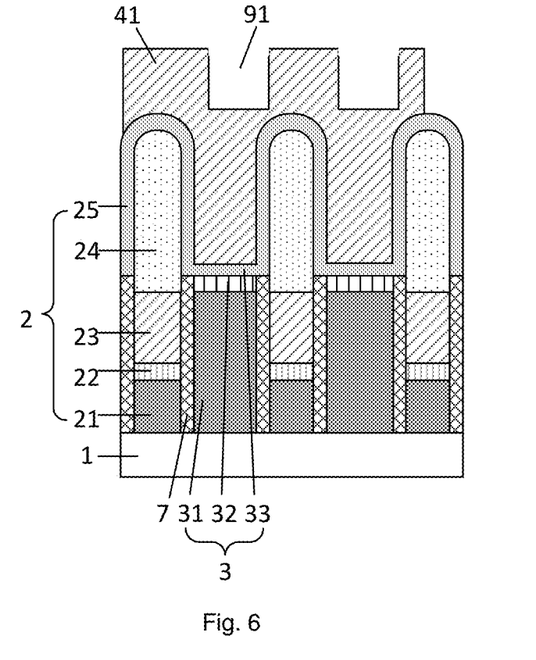
FIG. 6 is a schematic structural diagram of initial grooves formed according to an implementation of the present disclosure.

In this embodiment, in order to make the second conductive parts 42 formed later thicker, etching is performed in two steps when the first grooves 92 corresponding to each of the access unit are formed in the conductive layer 4, and therefore, Step S200 further includes:

Step S210: As shown in FIG. 6, parts of the conductive layer 4 corresponding to the recesses are etched for the first time to form initial grooves 91 corresponding to each of the access units, and in each access unit, the sidewall of the initial groove 91 is farther away from the bit line unit 2 compared with the sidewall of the same side of the recess. Shapes of the initial grooves 91 formed in this step are grooves with the same width as shown in the drawing. The grooves formed in this step are higher than the bit line units 2.

Step S220: The initial grooves 91 etched for the first time are etched downwards again, During this etching, parameters such as etching angle are adjusted to make the sidewalls (i.e., the left sidewalls in the drawing) of the newly etched grooves close to the bit line units form arc surfaces in the grooves depth direction (vertical direction), wherein the arc surfaces gradually approach the other opposite sidewalls in the direction toward the bottoms of the grooves, that is, the left sidewalls of the newly etched grooves are increasingly closer to the right sidewalls downwards, that is, the grooves etched in this step is increasingly narrower downwards, as shown in FIG. 7, and the finally formed complete first grooves 92 are the groove shapes formed after two times of etching. It should be noted that in the present application, it is only defined that the lower parts of the left sidewalls of the first grooves are arc surfaces, and the shapes of the right sidewalls are not defined; they may be vertical surfaces as shown in the drawing, or surfaces with a certain radian. In this step, the first grooves formed by two-step etching enable a smooth transition between the subsequently formed second conductive parts 42 and first conductive parts 41. As shown in the drawing, the bottoms of the first grooves 92 finally formed in this step are already lower than the upper surfaces of the bit line units 2; since the etching gas is for the conductive layer 4, the bit line unit 2 on the right is not etched; one part of the sidewalls of the first grooves 92 formed is the conductive layer 4, and the other part is the bit line units 2.

In this embodiment, dry etching is applied to etch the first grooves 92, and the etching gas is preferably a mixed gas of sulfur hexafluoride, chlorine, nitrogen and oxygen, which has an ideal etching effect on metallic tungsten. Of course, wet etching can also be used in other embodiments.

Figure 9:
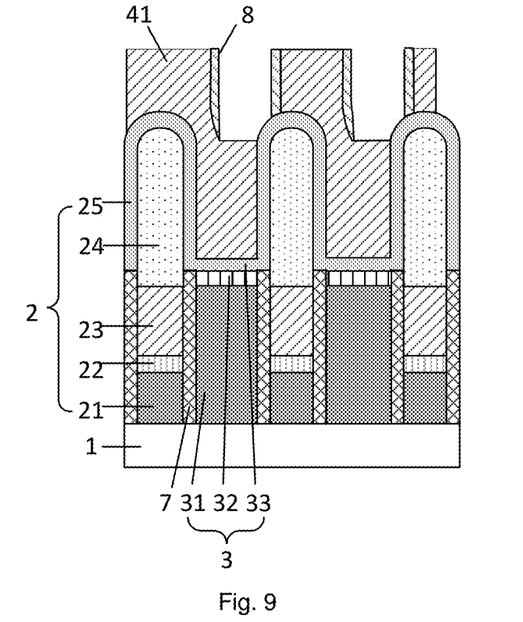
FIG. 9 is a schematic structural diagram of protective layers formed according to an implementation of the disclosure.

Step S300: Protective layers 8 are formed on the sidewalls of the first grooves 92.

Figure 8:
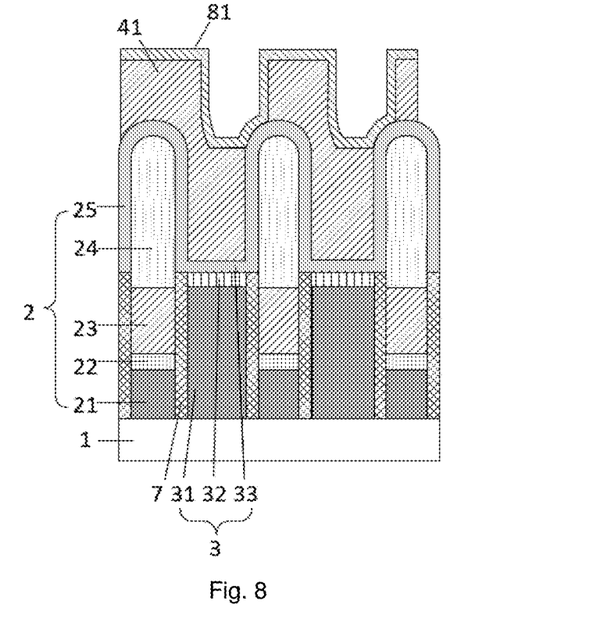
FIG. 8 is a schematic structural diagram of a protective material deposited according to an implementation of the present disclosure.

In this embodiment, the method for forming protective layers 8 on the first grooves 92 is to deposit the protective material 81 on the conductive layer 4, and the protective material 81 covers the first conductive parts 41 and the sidewalls and the bottom surfaces of the first grooves 92, as shown in FIG. 8. Then, the protective material 81 covering the first conductive parts 41 and the bottom surfaces of the first grooves 92 is etched away, and the protective material 81 covering the sidewalls of the first grooves 92 remains, thereby forming the protective layers 8. The shapes of the protective layers 8 match the shapes of the sidewalls of the first grooves 92 as shown in FIG. 9, so that the vertical surfaces and the arc surfaces of the first grooves are protected. The thickness of the protective layers 8 is preferably 5-10 nm, and the protective layers 8 of this thickness can ideally protect the sidewalls of the first grooves 92 and are not easy to affect the subsequent etching.

The material of the protective layers 8 formed on the sidewalls of the first grooves 92 includes but is not limited to silicon nitride, silicon dioxide, silicon oxynitride, titanium nitride, titanium dioxide, zirconium dioxide, and polysilicon, etc., and can be one of the above materials or any mixture thereof. The protective layers 8 may be formed by deposition process such as chemical vapor deposition (CVD), physical vapor deposition (PVD), atomic layer deposition (ALD), high density plasma CVD (HPCVD), metal organic CVD (MOCVD), and plasma enhanced CVD (PECVD).

Dry etching is preferably applied to this step to realize ideal selective etching. Since the material to be etched away is the protective layers 8, the etching gas is preferably a mixed gas of tetrafluoroethane, argon, and oxygen, and the mixed gas has a desirable etching effect on the protective layers 8 made of the above materials. The ratio of tetrafluoroethane, argon, and oxygen is preferably 5:1:1, which has an ideal etching effect on the protective layers 8.

Figure 10:
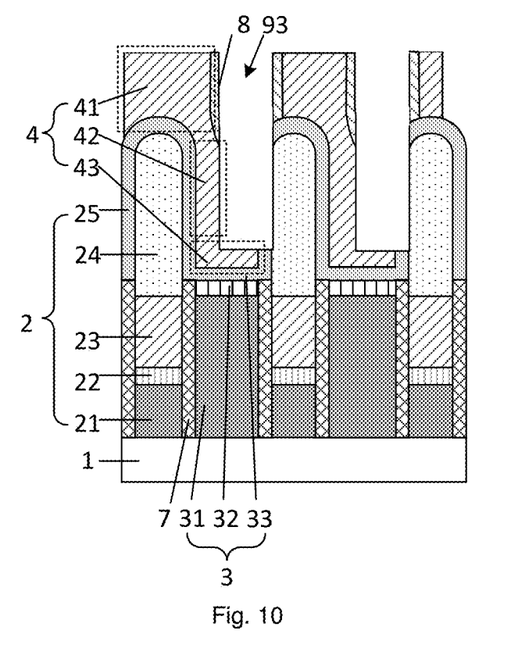
FIG. 10 is a schematic structural diagram of second grooves formed according to an implementation of the present disclosure.

Step S400: As shown in FIG. 10, the first grooves 92 are etched downwards to etch away parts of the conductive layers 4 in the recesses, and the second conductive parts 42 covering the sidewalls of the bit line units 2 and the third conductive parts 43 at the bottoms of the recesses are retained to form second grooves 93. Parts of the conductive layer covering the sidewalls of the bit line units and connected with the first conductive parts 41 are the second conductive parts 42, and parts of the conductive layer covering the bottoms of the recesses and connected with the second conductive parts 42 are the third conductive parts 43. The second conductive parts 42 and the third conductive parts 43 are divided as indicated by the dashed boxes in FIG. 10.

In this step, since the right sidewalls of the first grooves 92 are located on the adjacent bit line units, when downward etching continues, parts of the structures of the bit line units 2 are also etched away. Parts of bit line units 2 etched away are parts of the bit line protection layers, specifically, the silicon nitride layers and the titanium nitride layers of the bit line protection layers are partly etched away. Since the bottom surfaces of the bit line protection layers are not higher than the bottom surfaces of the recesses, silicon nitride and titanium nitride of a certain thickness still remain at the bottoms of the bit line protection layers to protect the bit line structural layers below. The bit line units are etched to a certain extent, so that the second grooves are wider, the subsequently formed insulating layer has a larger area and a good insulating effect. Since the widths of the first grooves 92 and the second grooves 93 may affect the widths of the upper surfaces of the adjacent bit line units, and further affect the areas of the adjacent first conductive parts 41, the widths of the first grooves 92 and the second grooves 93 should be controlled during etching to take account of the areas of the insulating layer and the first conductive parts.

In the etching process, due to the protection of the protective layers 8, the sidewalls of the first grooves 92 are not affected, and further downward etching will be performed along the lowermost direction of the protective layers 8, that is, along the minimum widths of the first grooves 92, so that the second grooves 93 formed are relatively narrow, and the remaining parts of the conductive layer on the corresponding sidewalls of the recesses are thicker, that is, the second conductive parts 42 are thicker, so that breakage is not easy to occur here. Meanwhile, the contact areas between the bottoms of the second conductive parts 42 and the third conductive parts 43 are obviously larger, so that, when etching, it is no longer sensitive to the influencing factors of alignment process offset of photoetching process, and a wider alignment process space can be obtained in the process. Furthermore, since the lower parts of the first grooves 92 are closing up, the second conductive parts 42 and the first conductive parts 41 can form a smooth transition. Shapes of the second grooves 93 are as shown in FIG. 10, in which parts of the sidewalls are the conductive layer 4, and the other parts are the bit line units 2.

Dry etching is preferably applied to this step to realize ideal selective etching. In this step, the conductive layer 4 and the bit line units 2 are to be etched, that is, among various materials such as metallic tungsten, silicon nitride and titanium nitride, the etching gas is preferably a mixed gas of tetrafluoroethane, argon, and oxygen, wherein, tetrafluoroethane has a better etching effect on materials such as silicon nitride and titanium nitride of the bit line units 2, argon and oxygen have a better etching effect on metallic tungsten of the conductive layer 4, the content of different etching gases can be adjusted according to the material to be etched to achieve the etching effort of forming the structure in the drawing, and preferably, the ratio of tetrafluoroethane, argon, and oxygen is (3-5):1:1, wherein, in this range, the etching rates on the above film layers are similar, which is more favorable for obtaining the shapes of the second grooves 93 shown in the drawing.

Figure 11:
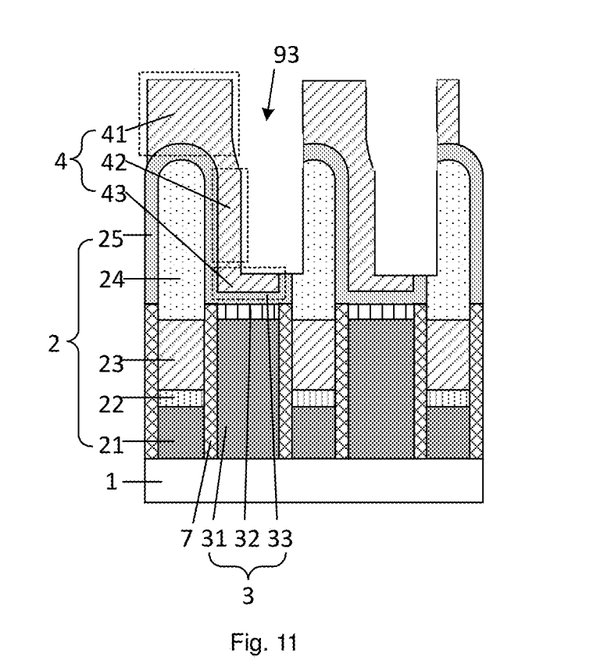
FIG. 11 is a schematic structural diagram of protective layers removed according to an implementation of the disclosure.

Step S500: As shown in FIG. 11, the protective layers 8 are removed.

In this step, the protective layers 8 may be removed by etching. As mentioned above, when dry etching is used, and when the material of the protective layers 8 is silicon nitride, the preferred ratio of the etching gas is 5:1:1 of tetrafluoroethane, argon, and oxygen. In other embodiments, other removal processes such as wet etching may also be used. Since the etching gas is for the protective layers 8, the material of the conductive layer will not be etched by mistake when the protective layers 8 are removed, ensuring that the second conductive parts 42 will not be thinner or even break.

Step S600: Storage capacitors 6 are formed on the side of the conductive layer 4 away from the substrate 1, so that the storage capacitors 6 are in contact with the conductive layer 4.

Figure 12:
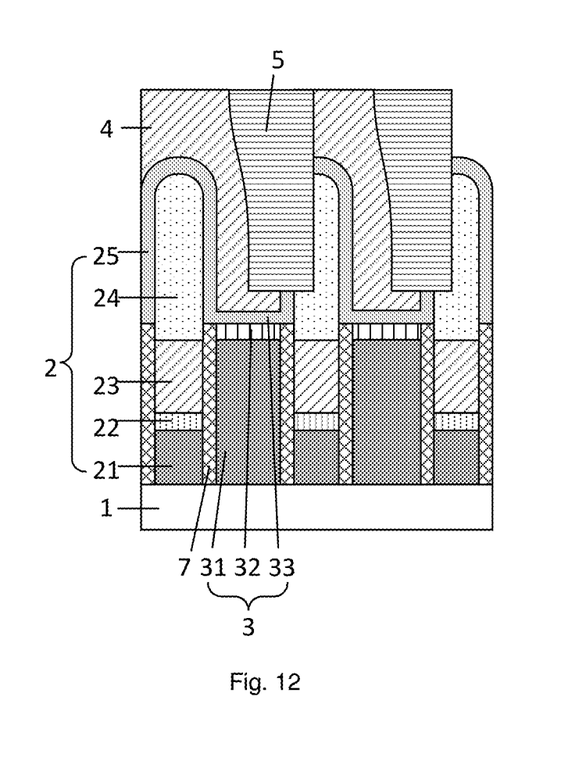
FIG. 12 is a schematic structural diagram of the insulating layer formed according to an implementation of the present disclosure.

In this step, firstly, an insulating layer is filled in the second grooves, and then a support layer 10 with capacitor holes 101 is formed on, and then capacitors 6 are formed in the capacitor holes 101. Therefore, this step may further comprise the following steps:

Step S610: An insulating layer is deposited in the second grooves, as shown in FIG. 12; the material of the insulating layer may be the same as that of the insulating sidewalls 7, and it will not be repeated here. The upper surface of the insulating layer 5 may be flush with the upper surfaces of the first conductive parts 41.

Figure 13:
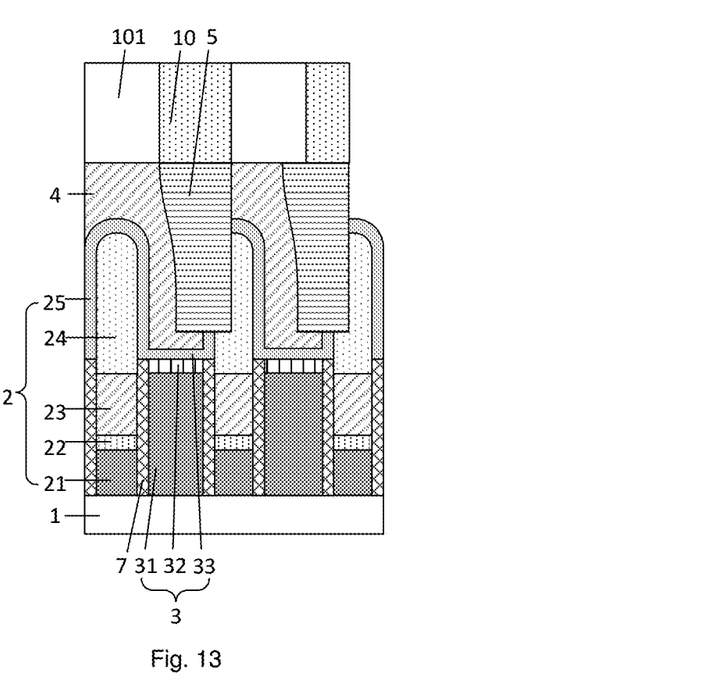
FIG. 13 is a schematic structural diagram of capacitor holes formed according to an implementation of the present disclosure.

Step S620: Referring to FIG. 13, a support layer 10 is formed on the conductive layer and the insulating layer 5. The support layer 10 covers the first conductive parts 41 and the insulating layer 5, and is used to form a support structure for storage capacitors to be formed later.

Step S630: Perforative capacitor holes 101 are etched at the positions of the support layer 10 corresponding to the first conductive parts 41, exposing the first conductive parts 41, as shown in FIG. 13.

Figure 14:
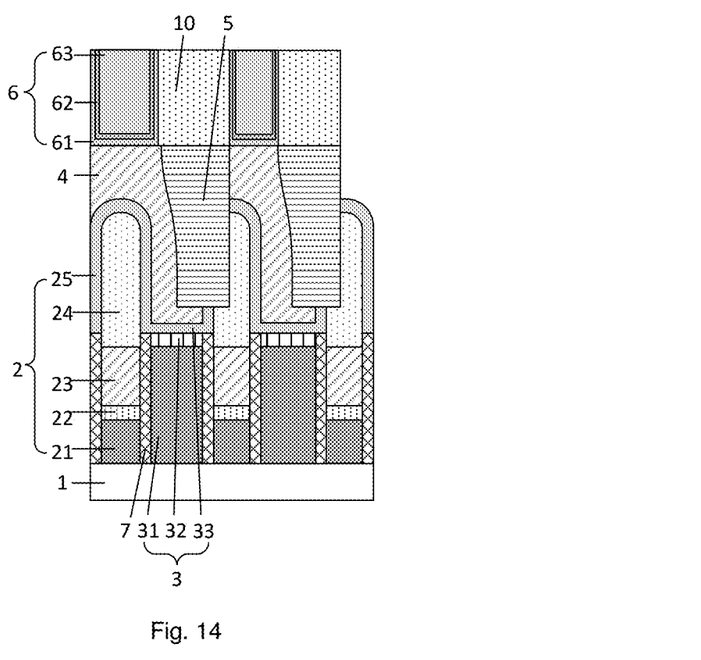
FIG. 14 is a schematic structural diagram of storage capacitors formed according to an implementation of the present disclosure.

Step S640: Storage capacitor 6 are formed in the capacitor holes 101, and comprises bottom electrodes 61, dielectric layers 62 and top electrodes 63, wherein the bottom electrodes 61 contact the first conductive parts 41, and is thereby electrically connected with the capacitor contacts 3, as shown in FIG. 14. The structure of the storage capacitors 6 is only an example, and it may have other structures, which are not enumerated here one by one.

The conductive layer formed using the above method can form thicker second conductive parts 42, with a thickness of 20-30 nm. In the conductive layer structure formed by the prior method, the thickness of the second conductive parts is only about 15 nm. The second conductive parts 42 formed by the method in this present application are not easy to break, and ensure that the storage capacitors 6 and the capacitor contacts 3 form a good electric contact, thereby realizing data access, and the thicker second conductive parts 42 ensure a lower contact resistance between the capacitors and the capacitor contacts, thereby improving the data transmission efficiency of the access units. Meanwhile, the contact areas between the bottoms of the second conductive parts 42 and the third conductive parts 43 formed using the above method are obviously larger, therefore, it is no longer sensitive to the influence factors of alignment process offset of photo-etching process during etching, so there is a wider alignment process space in the process. Therefore, this method can meet the requirements of the gradually shrinking size of the semiconductor device and the high requirements for storage performance.

In the embodiment of the present disclosure, a semiconductor device prepared with the above method is also provided. As shown in FIG. 14, the semiconductor device prepared using the above method comprises a substrate 1, on which a plurality of bit line units 2 and a plurality of capacitor contacts 3 are provided; the plurality of bit line units 2 and the plurality of capacitor contacts 3 are alternately arranged one by one and insulated from each other through insulating sidewalls 7, the bit line units 2 are higher than the capacitor contacts 3, and a recess is formed between two adjacent bit line units 2; the substrate 1 is further provided with a conductive layer 4 covering the bit line units 2 and the capacitor contacts 3, the conductive layer 4 comprises first conductive parts 41 located on the bit line units 2, second conductive parts 42 covering one sidewall of each of the recesses, and third conductive parts 43 covering the bottom surfaces of the recesses, the three conductive parts are connected into a whole, and may be divided with reference to the dashed boxes in FIG. 10 or FIG. 11. Other parts of the recesses are filled with an insulating layer 5, a support layer 10 is provided on the insulating layer 5 and the conductive layer 4, capacitor holes 101 are formed at the positions of the support layer 10 located on the first conducting parts 41, capacitors 6 are provided in the capacitor holes 101, and the bottom electrodes 61 of the capacitors 6 are in contact with the first conducting parts 41 and are further electrically connected with the capacitor contacts 3.

The second conductive parts 42 of this semiconductor device are thicker, and the thickness can reach 20-30 nm, are not easy to break, have low contact resistances, and ensure that the storage capacitors 6 and the capacitor contacts 3 form a good electric contact, thereby improving the data transmission efficiency of the access units. Meanwhile, this structure also makes the storage capacitor 6 to form the hexagonal closest packing, which helps to further reduce the size of the semiconductor device.

Although relative terms, such as "upper" and "lower," are used in the present specification to describe one component of an illustration relative to another, such terms are used herein for convenience only, e.g., with reference to the orientation of the example illustrated in the drawings. It should be understood that if the illustrated device is turned upside down, a component described as "upper" will become a "lower" one. When a structure is "on" other structure, it may mean that this structure is integrally formed on other structure, or "directly" disposed on other structure, or "indirectly" disposed on other structure via another structure.

The terms "a", "one", "that", "the" and "at least one" are used to indicate the presence of one or more elements/components/parts/etc.; the terms "comprise" and "have" are intended to be inclusive and mean that there may be additional elements/components/etc. besides those listed.

Those skilled in the art can easily think of other embodiments of the present disclosure when considering the specification and practicing the present disclosure. The present application is intended to cover any variants, uses or adaptive changes of the present disclosure, these variants, uses or adaptive changes follow the general principles of the present disclosure and include common knowledge or customary technical means in the art not disclosed in the present disclosure. The specification and the embodiments are deemed exemplary only, and the true scope and spirit of the present disclosure are indicated by the following claims.

The invention claimed is:

1. A preparation method of a semiconductor device, comprising:
   providing a substrate, wherein there is a plurality of access units formed on the substrate, and each of the access units comprises a bit line unit and a capacitor contact; the bit line units and the capacitor contacts of the plurality of access units are alternately arranged one by one and insulated from each other, and the bit line units are higher than the capacitor contacts, so that a recess is formed between the two adjacent bit line units; a conductive layer covering each of the access units is further formed on the substrate, and each of the recesses is filled with the conductive layer;
   etching parts of the conductive layer corresponding to the recesses and forming first grooves corresponding to each of the access units in the conductive layer; in the access units, sidewalls of the first grooves close to the bit line units are farther away from the bit line units compared with the sidewalls of the same side of the recesses;
   forming protective layers on sidewalls of the first grooves;
   etching the first grooves downwards to etch away parts of the conductive layer located in the recesses, and retain the conductive layer covering sidewalls of the bit line units and bottoms of the recesses, to form second grooves; parts of the conductive layer positioned above the bit line units are first conductive parts, parts of the conductive layer covering the sidewalls of the bit line units and connected with the first conductive parts are second conductive parts, and parts of the conductive layer covering the bottoms of the recesses and connected with the second conductive parts are third conductive parts;
   removing the protective layers; and
   forming storage capacitors on sides of the first conductive parts away from the substrate, so that the storage capacitors are in contact with the first conductive parts.

2. The preparation method of a semiconductor device according to claim 1, wherein the forming the first grooves corresponding to each of the access units in the conductive layer, comprises:
   etching parts of the conductive layer corresponding to each of the recesses for a first time and forming a plurality of initial grooves, so that in each of the access units, sidewall of the initial groove close to the bit line unit is farther away from the bit line unit compared with the sidewall of the same side of the recess; and etching the initial grooves downwards again so that sidewalls of newly etched grooves close to the bit line units form arc surfaces in a depth direction of the grooves, wherein the arc surfaces are gradually closer to opposite sidewalls in a direction towards bottoms of the grooves, to obtain the first grooves.

3. The preparation method of a semiconductor device according to claim 2, wherein the forming the protective layers on sidewalls of the first grooves of the conductive layer, comprises:

depositing a protective material on the conductive layer, so that the protective material covers upper surface of the conductive layer, and sidewalls and bottom surfaces of the first grooves; and etching parts of the protective material covering the upper surface of the conductive layer and the bottom surfaces of the first grooves, and retaining parts of the protective material covering the sidewalls of the first grooves and forming the protective layers.

4. The preparation method of a semiconductor device according to claim 1, wherein the bit line unit comprises a bit line structure layer formed on the substrate and a bit line protection layer located on side of the bit line structure layer away from the substrate, and bottom surface of the bit line protection layer is not higher than bottom surface of the recess;

when part of the conductive layer in the recess is etched to form the second groove, part of the bit line protection layer is etched away.

5. The preparation method of a semiconductor device according to claim 3, wherein the protective material is one of or a mixture of two or more of silicon nitride, silicon dioxide, silicon oxynitride, titanium nitride, titanium dioxide, zirconium dioxide, and polysilicon.

6. The preparation method of a semiconductor device according to claim 5, wherein a thickness of the protective layer is 5-10 nm.

7. The preparation method of a semiconductor device according to claim 1, wherein an etching gas for forming the first grooves is a mixed gas of sulfur hexafluoride, chlorine, nitrogen and oxygen.

8. The preparation method of a semiconductor device according to claim 1, wherein, an etching gas for forming the second grooves and for etching the protective layers is a mixed gas of tetrafluoroethane, argon, and oxygen.

9. The preparation method of a semiconductor device according to claim 1, wherein, the forming the storage capacitors comprises:

filling insulating layer in the second grooves;

forming a support layer on the conductive layer and the insulating layer;

forming perforative capacitor holes at positions of the support layer corresponding to the first conductive parts, wherein the capacitor holes expose the first conductive parts; and forming a bottom electrode, a dielectric layer and a top electrode of a capacitor sequentially in the capacitor hole, wherein the bottom electrode is in contact with the first conductive part.

10. A semiconductor device obtained by the preparation method according to any one of claims 1 to 9.

* * * * *